United States Patent [19]
Babcock

[11] Patent Number: 5,345,235
[45] Date of Patent: Sep. 6, 1994

[54] SCALED REFERENCE ANALOG-TO-DIGITAL CONVERSION CIRCUITRY AND METHOD OF OPERATION

[75] Inventor: Mark H. Babcock, Austin, Tex.

[73] Assignee: Motorola, Inc., Schaumburg, Ill.

[21] Appl. No.: 44,683

[22] Filed: Apr. 12, 1993

[51] Int. Cl.[5] .............................................. H03M 1/18
[52] U.S. Cl. ...................................... 341/139; 341/155
[58] Field of Search ............... 341/139, 118, 120, 132, 341/155, 156

[56] References Cited

U.S. PATENT DOCUMENTS 5,034,745 7/1991 Kelly .................................... 341/155
5,057,841 10/1991 Veerhoek et al. .................... 341/156

*Primary Examiner*—Brian K. Young
*Attorney, Agent, or Firm*—Kelly A. Gardner

[57] ABSTRACT

Circuitry for converting analog signal voltages to digital values comprises an analog-to-digital (A/D) converter (170) for receiving an analog signal voltage and analog reference voltages and for generating in accordance therewith a first digital value. The circuitry further comprises first and second digital-to-analog (D/A) converters (175, 180) coupled to the A/D converter (170) for providing the analog reference voltages to the A/D converter (170). A controller (120) coupled to the first and second D/A converters (175, 180) and the A/D converter (170) receives the first digital value and generates therefrom at least a second digital value for subsequent transmission to at least one of the first and second D/A converters (175 or 180), in response to which the at least one of the first and second D/A converters (175 or 180) adjusts at least one of the analog reference voltages provided to the A/D converter (170).

15 Claims, 4 Drawing Sheets

SCALED REFERENCE ANALOG-TO-DIGITAL CONVERSION CIRCUITRY AND METHOD OF OPERATION

FIELD OF THE INVENTION

This invention relates in general to digital circuits, and more specifically to analog-to-digital conversion circuitry having adjustable reference inputs.

BACKGROUND OF THE INVENTION

Analog-to-digital (A/D) converters are typically utilized to convert analog voltages to digital voltages, i.e., digital values representative of analog voltages. Conventionally, high and low reference voltages applied to the inputs of an A/D converter determine a range within which an applied analog voltage can fluctuate. The A/D converter then converts the analog voltage to the closest of several digital voltage "steps", which are determined by the number of bits and the range of the A/D converter. The number of steps within a specified range are given by the formula resolution=$2^{(\# \, bits)}$, and the step size of the A/D converter is given by the formula $$\text{step size} = \frac{\text{range}}{2^{(\# \, bits)}}.$$

By way of example, a 4-bit A/D converter having a range of 8 volts has 16 steps (24 steps) representative of 0.5 volts each ($8/2^4$ volts/step). When an analog voltage is applied, the A/D converter converts the analog voltage to the closest 0.5 volt step. If, for instance, an analog voltage of 7.44 volts is applied to the A/D converter, a digital output representative of 7.5 volts results. If the digital output is provided in a binary number form, for example, the output would be 1-1-1-0.

In radio communication applications, conventional A/D converters of the type described above are utilized to convert received radio signal voltages from analog format to digital format for subsequent generation of digital data. When the incoming radio signal is relatively large in amplitude, i.e., the voltage levels of the signal vary widely, the digital transformation performed by the A/D converter may be quite useful for accurate generation of digital data. However, when the signal amplitude is small, the results of the A/D conversion may not be quite so useful. Specifically, when the voltage levels of an incoming signal vary over only a few of the A/D steps, the resolution of the A/D converter may be such that no distinction in the digital output can be made.

If, for example, a 5.3 volt signal which fluctuates from 5.00 to 5.60 volts is received by the above-described 8-V, 4-bit A/D converter, only two of the 0.5 volt A/D steps are encompassed. As a result, the digital output will vary only from 5.0 to 5.5 volts as the signal fluctuates, and the smaller voltage variations cannot be distinguished.

One solution to this problem is to utilize an A/D converter having a smaller voltage range and, therefore, smaller A/D steps. However, there is then a risk that the incoming radio signal might be entirely out of the range of the A/D converter if the voltage level of the signal varies. In this situation, the radio communication device might never detect the presence of the incoming signal.

Another solution to the problem is to utilize an A/D converter having an increased number of bits, which results in a larger number of A/D steps over the same voltage range. The digital output of the A/D converter may then more accurately distinguish between small voltage variations in the analog radio signal. However, this increased resolution can be obtained only at a greater cost, which is typically reflected in the price of the final product, i.e., the radio communication device, utilizing the A/D converter. Furthermore, increasing the resolution can sometimes affect the speed of the A/D converter. Therefore, the use of A/D converters having greatly increased resolutions may not be feasible for applications in which only a small minority of the incoming radio signals have very small voltage variations or for applications in which conversion speed is of concern.

A need exists, therefore, for an A/D converter which yields accurate digital voltages for applied analog radio signals having small voltage variations. Additionally, the A/D converter should be able to process analog radio signals received across a large voltage range without a significant reduction in conversion speed.

SUMMARY OF THE INVENTION

A method for increasing the effective resolution of an analog-to-digital (A/D) converter, which receives analog voltages and converts the analog voltages to digital values, comprises the steps of providing high and low analog reference voltages to the A/D converter and receiving the digital values from the A/D converter for an amount of time. A highest value of the digital values received during the amount of time is compared to a peak threshold value stored in memory, and a lowest value of the digital values received during the amount of time is compared to a valley threshold value stored in the memory. The high analog reference voltage is replaced with a voltage representative of the peak threshold value when the highest value of the digital values is less than the peak threshold value, and the low analog reference voltage is replaced with a voltage representative of the valley threshold value when the lowest value of the digital values is greater than the valley threshold value.

Circuitry for converting analog signal voltages to digital values comprises an analog-to-digital (A/D) converter for receiving the analog signal voltages and high and low analog reference voltages and for generating in accordance therewith the digital value. A receiver receives the digital values from the A/D converter for an amount of time, and comparing circuitry coupled to the receiver compares a highest value of the digital values received during the amount of time to a peak threshold value stored in memory. The comparing circuitry also compares a lowest value of the digital values received during the amount of time to a valley threshold value stored in the memory. Replacing circuitry coupled to the comparing circuitry and the A/D converter replaces the high analog reference voltage with a voltage representative of the peak threshold value when the highest value of the digital values is less than the peak threshold value. The low analog reference voltage is replaced with a voltage representative of the valley threshold value when the lowest value of the digital values is greater than the valley threshold value.

DESCRIPTION OF A PREFERRED EMBODIMENT

Figure 1:
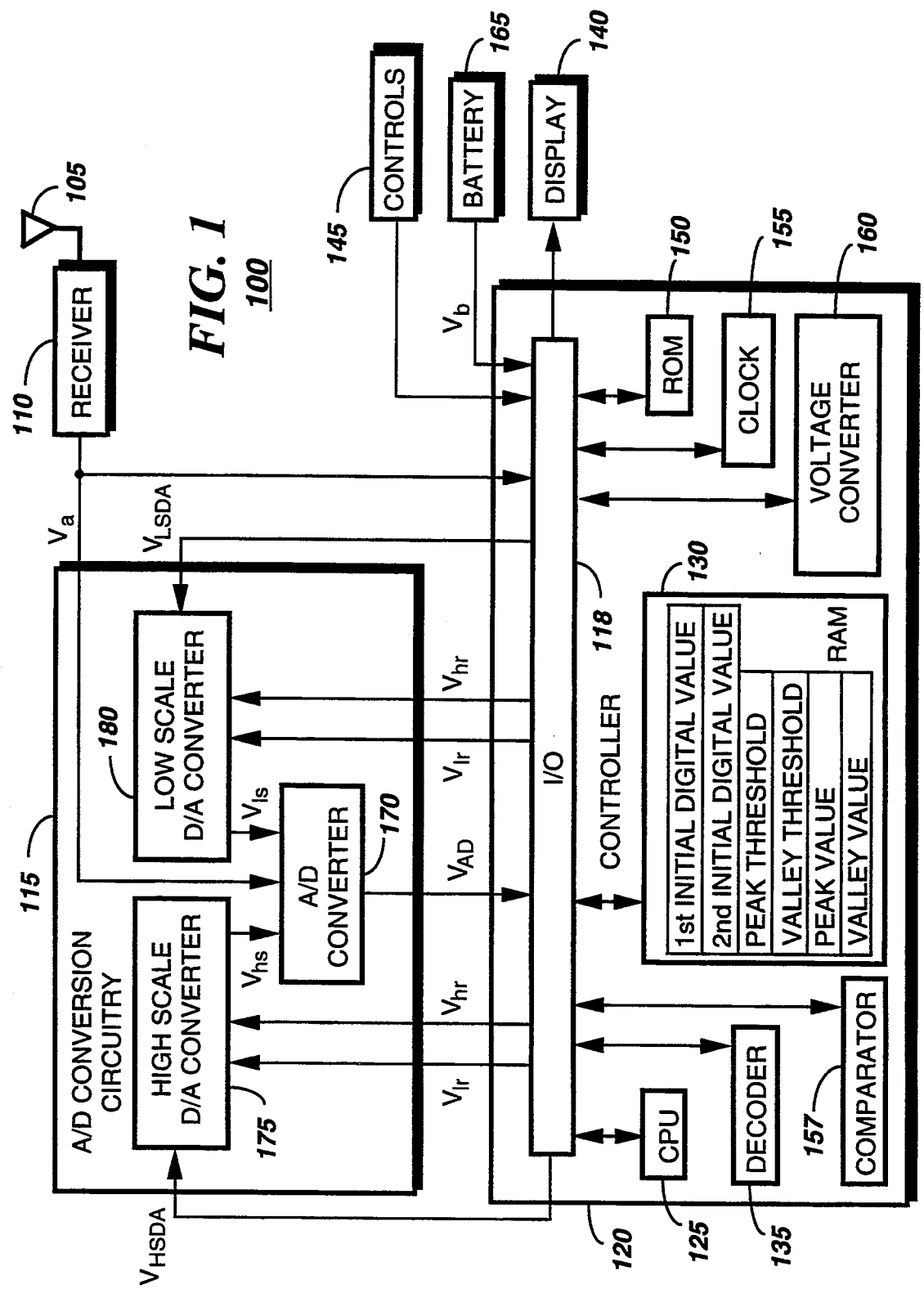
FIG. 1 is an electrical block diagram of a radio communication device including analog-to-digital conversion circuitry in accordance with the preferred embodiment of the present invention.

FIG. 1 depicts a radio communication device 100 according to the present invention. The radio communication device 100 comprises an antenna 105 for receiving a radio frequency signal and a receiver 110 coupled to antenna 105 for converting the radio frequency signal into a stream of analog signal voltages in a manner well known to one of ordinary skill in the art. Preferably, the radio communication device 100 further includes analog-to-digital (A/D) conversion circuitry 115 for converting the analog signal voltages into digital values, such as binary numbers, which are representative of the analog signal voltages.

The digital values are thereafter provided to an input/output (I/O) bus 118 of a controller 120 for controlling the operation of the radio communication device 100. The controller 120 may be, for example, an MC68HC05C4 microcomputer manufactured by Motorola, Inc. of Schaumburg, Ill. Alternatively, the controller 120 may be implemented by other hard-wired circuitry capable of performing the same operations.

According to the present invention, the controller 120 comprises a central processing unit (CPU) 125 for receiving the digital values generated by the A/D conversion circuitry 115. The CPU 125 preferably stores the highest of the digital values received in a predetermined period of time, e.g., a symbol time, as a signal "peak" value in a memory, such as a random access memory (RAM) 130. Additionally, the CPU 125 stores in the RAM 130 the lowest of the digital values received in the predetermined period time as a signal "valley" value. The CPU 125 thereafter, in a manner well known to one of ordinary skill in the art, utilizes the signal peak and valley values to generate a stream of digital data from the analog signal voltages provided by the receiver 110. A decoder 135 coupled to the CPU 125 and internal to the controller 120 subsequently decodes the digital data to recover message information, which may also be stored in the RAM 130. The message information may be retrieved from the RAM 130 and provided to a display device 140 for presentation to a user either automatically or in response to user manipulation of controls 145 accessible from the exterior of the radio communication device 100.

In addition to the RAM 130, the controller 120 preferably includes a read only memory (ROM) 150, such as an electrically erasable programmable read only memory (EEPROM), for storing subroutines executed by the controller 120 during operation of the radio communication device 100. Additionally, a clock 155 internal to the controller 120 provides timing signals utilized by the CPU 125 for operation of the radio communication device 100, and a comparator 157 internal to the controller 120 is utilized to compare digital values received by the controller 120 to values stored in the RAM 130 or the ROM 150. A voltage converter 160 further included within the controller 120 converts an analog voltage supplied by a battery 165 or other power source to high and low analog reference voltages provided to the A/D conversion circuitry 115.

In accordance with the preferred embodiment of the present invention, the A/D conversion circuitry 115 comprises a conventional A/D converter 170, the high and low reference inputs of which are coupled to the analog outputs of first and second digital-to-analog (D/A) converters 175, 180. As mentioned above, the A/D converter 170 generates, in accordance with the reference voltages supplied by the D/A converters 175, 180, digital values from the analog voltages supplied thereto by the receiver 110.

The D/A converters 175, 180, hereafter referred to as low and high scale D/A converters, receive the low and high reference voltages generated by the voltage converter 160. Additionally, the low scale D/A converter 180 receives from the CPU 125 a first digital value, which is thereafter converted to an analog voltage supplied to the low reference input of the A/D converter 170. In like manner, the CPU 125 provides a second digital value to the high scale D/A converter 175 for conversion to an analog voltage utilized by the A/D converter 170 as its high reference voltage.

In this manner, the controller 120 can advantageously control the low and high reference voltages of the A/D converter 170 by adjusting the digital values supplied to the low and high scale D/A converters 175, 180. As a result, the controller 120 has direct control over the effective resolution of the A/D converter 170. The actual resolution, i.e., the number of digital steps, of the A/D converter 170, which is given by the formula resolution $= 2^{(\# \; bits)}$, remains constant. However, the size of the digital steps depends on the range of the A/D converter 170. This is illustrated by the formula $$\text{step size} = \frac{V_{hs} - V_{ls}}{\text{resolution}},$$

wherein $V_{hs}$ refers to the high reference voltage provided to the A/D converter 170 and $V_{ls}$ refers to the low reference voltage. It may be appreciated, therefore, that the resolution of the A/D converter 170 may be effectively increased or decreased by varying the digital values provided to the D/A converters 175, 180, and thus the range of the high and low reference voltages supplied to the A/D converter 170. Furthermore, the variation of the resolution is accomplished without decreasing the conversion speed of the A/D converter.

Typically, the voltage at which a radio frequency signal is received can vary. Additionally, the amplitude of the radio frequency signal varies. Therefore, it is desirable that the A/D converter 170 have a range that is large enough to ensure reception and processing of even widely fluctuating analog signal voltages generated from the radio frequency signal. At the same time, it is desirable for the range of the A/D converter 170 to be small enough to accurately generate digital values from the analog signal voltages having small variations. The ability of the A/D conversion circuitry 115 to increase and decrease the high and low reference voltages, and thus the effective resolution of the A/D converter 170, is therefore especially advantageous in electronic devices such as the radio communication device 100, which may be, for example, a paging receiver for receiving message information included in radio frequency signals.

Figure 2:
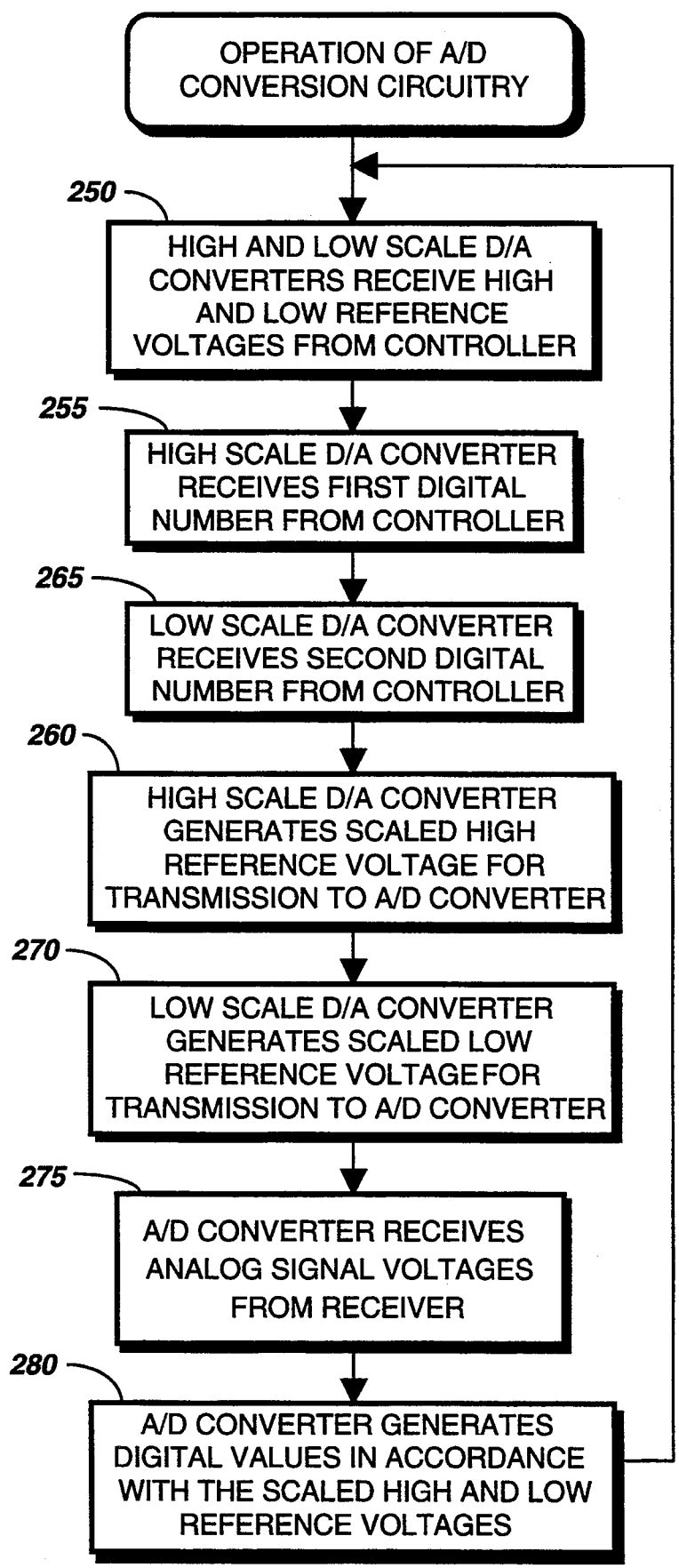
FIG. 2 is a flowchart depicting the operation of the analog-to-digital conversion circuitry of FIG. 1 in accordance with the preferred embodiment of the present invention.

The operation of the A/D conversion circuitry 115 may be better understood by referring next to the flowchart shown in FIG. 2. As described above, the high and low scale D/A converters 175, 180 receive, at step 250, the analog high and low references from the voltage converter 160 internal to the controller 120. Additionally, the high scale D/A converter 175 receives, at step 255, a digital number from which an analog voltage is generated at step 260. The analog voltage generated by the high scale D/A converter 175 is provided to the A/D converter for use as a scaled high reference voltage. Similarly, at step 265, the low scale D/A converter 180 receives from the controller 120 a digital number from which a scaled low reference voltage is generated, at step 270, in a manner well known to one of ordinary skill in the art. The A/D converter 170 thereafter, at step 275, receives the analog signal voltages from the receiver 110 (FIG. 1) and, at step 280, generates digital values therefrom in accordance with the scaled high and low reference voltages provided by the low and high scale D/A converters 175, 180. These digital values are subsequently provided to the CPU 125 of the controller 120.

Figure 3:
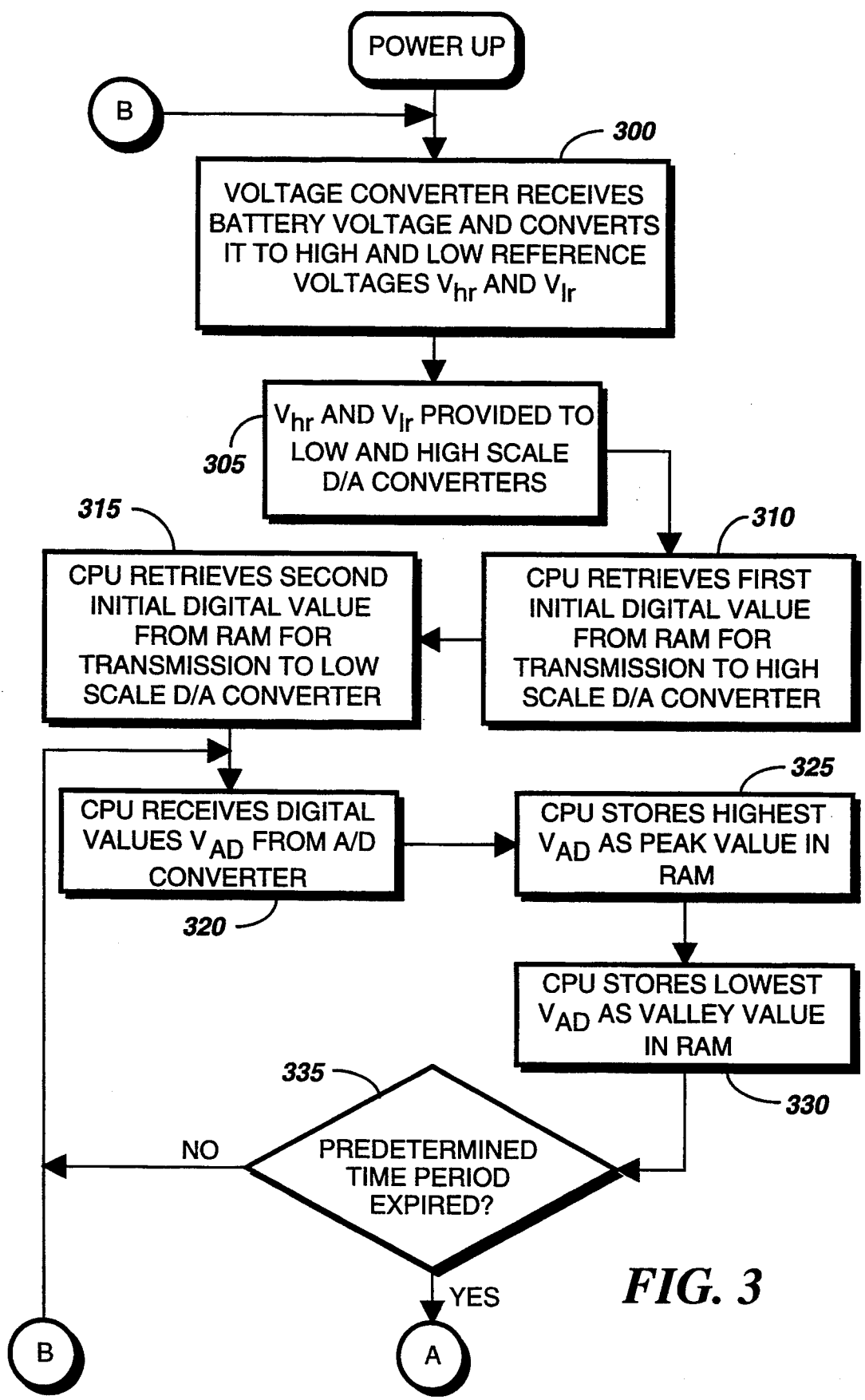
FIGS. 3 and 4 are flowcharts depicting the operation of a controller for controlling the operation of the analog-to-digital conversion circuitry of FIG. 1 in accordance with the preferred embodiment of the present invention.
Figure 4:
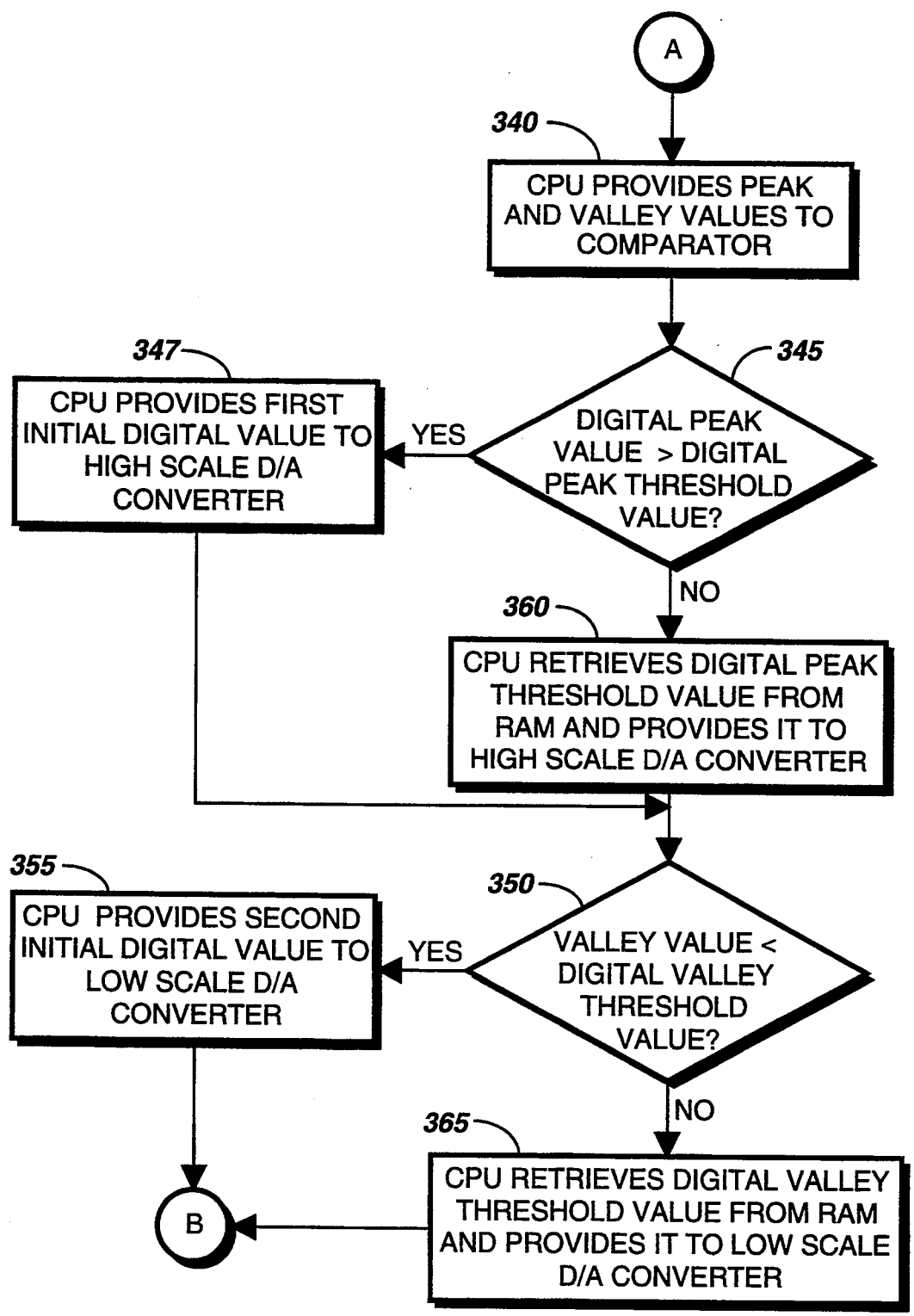

With reference to FIGS. 3 and 4, a flowchart depicts the operation of the controller 120, which conveniently varies the effective resolution of the A/D converter 170. As shown, when the radio communication device 100 (FIG. 1) is powered up, the voltage converter 160 receives, at step 300, an analog voltage provided by a power source, such as the battery 165, and converts the analog voltage to high and low reference voltages in a conventional manner. Thereafter, the high and low reference voltages are each provided, at step 305, to the low and high scale D/A converters 175, 180.

Upon power-up, the CPU 125, at step 310, retrieves from the RAM 130 an initial digital value for transmission to the input of the high scale D/A converter 175. Preferably, the initial digital value corresponds to the high reference voltage generated by the voltage converter 160. Additionally, another initial digital value stored in the RAM 130 is retrieved, at step 315, by the CPU 125 and provided to the input of the low scale D/A converter 180. This initial digital value preferably corresponds to the low reference voltage generated by the voltage converter 160. In this manner, the A/D converter 170 can initially receive analog signal voltages over a maximum range determined by the digital values provided, at steps 310, 315, to the D/A converters 175, 180.

Subsequently, the CPU 125 receives, at step 320, the digital values generated by the A/D converter 170 as described above. In accordance with the present invention, the CPU 125 stores, at step 325, the highest of the digital values as a "peak" value in the RAM 130. Similarly, at step 330, the CPU 125 stores the lowest of the digital values as a "valley" value in the RAM 130. Alternatively, the peak and valley values could be stored in counters or other types of state machines rather than the RAM 130.

After expiration, at step 335, of a predetermined time period, such as a symbol-time, the CPU 125 provides, at step 340, the peak and valley values to the comparator 157, which thereafter compares the peak and valley values to digital peak and valley threshold values stored in the RAM 130. When, at step 345, the peak value is greater than the peak threshold value, the CPU 125 continues to provide, at step 347, the same digital value, i.e., the first initial digital value, to the high scale D/A converter 175. In like manner, when the valley value is determined, at step 350, to be less than the valley threshold value, the CPU 125 continues to provide, at step 355, the same digital value to the low scale D/A converter 180. In this manner, the range of the A/D converter 170 remains the same when the highest and lowest digital values, i.e., the peak and valley values, remain outside the boundaries defined by the peak and valley threshold values.

When, at step 345, the peak value is less than the peak threshold value, the CPU 125 retrieves, at step 360, the peak threshold value from the RAM 130. The peak threshold value is transmitted to the input of the high scale D/A converter 175, thereby effectively decreasing the scaled high reference voltage provided to the A/D converter 170. As a result, the range of the A/D converter 170 is decreased. Similarly, when the valley value is determined, at step 350, to be greater than the valley threshold value, the CPU 125 retrieves, at step 365, the valley threshold value for transmission to the low scale D/A converter 180. The low scale D/A converter 180 thereafter generates an increased analog voltage that is provided to the A/D converter 170 for use as the scaled low reference voltage. The CPU 125 is, in this manner, able to conveniently vary the effective resolution of the A/D converter 170.

As described above, the controller 120 provides one of only two stored digital values, i.e., the first initial digital value or the peak threshold value, to the high scale D/A converter 175 and one of two stored digital values to the low scale D/A converter 180. In alternate embodiments of the present invention, however, a controller could, instead of providing selected stored values to D/A converters, calculate digital values for transmission to the D/A converters from the outputs generated by the A/D converter. By way of example, the controller could, within the range of the A/D converter, provide a digital value to the high scale D/A converter that is a predetermined number of digital steps above the peak value. Similarly, the controller could provide a digital value to the low scale D/A converter that is a predetermined number of digital steps below the valley value. In this manner, the resolution of the A/D conversion circuitry 115 could be zoomed in or out as necessary without relying on a limited number of digital values stored in a memory and provided to the D/A converters 175, 180.

In summary, the radio communication device as described above includes A/D conversion circuitry for converting analog signal voltages to digital values for use in decoding received signals. The A/D conversion circuitry comprises an A/D converter and two D/A converters, one of which provides the high reference voltage to the A/D converter and one of which provide the low reference voltage to the A/D converter. A controller, such as a microcomputer, provides varying digital values to the D/A converters, thereby controlling the high and low reference voltages provided to the A/D converter. As a result, the controller can conveniently increase and decrease the range, and thus the effective resolution, of the A/D converter because the range is directly dependent on the high and low reference voltages.

This feature is especially advantageous for use in a radio communication device in which the controller can vary the range of the A/D converter to ensure the accurate processing of received radio signals. By way of example, when the radio communication device receives a radio signal having a very large amplitude, the controller can increase the range of the A/D converter such that the entire voltage range of the radio signal is processed. Conversely, when a received radio signal has a small amplitude, the range of the A/D converter can be decreased to more accurately generate digital representations of the signal voltages.

It may be appreciated by now that there has been provided a method for conveniently varying the effective resolution of A/D conversion circuitry, without decreasing conversion speed, in response to reception of varying signal voltages.

What is claimed is:

1. A method for increasing the effective resolution of an analog-to-digital (A/D) converter for receiving analog voltages and converting the analog voltages to digital values, the method comprising the steps of:
   (a) providing high and low analog reference voltages to the A/D converter;
   (b) receiving the digital values from the A/D converter for an amount of time;
   (c) comparing a higher value of the digital values received during the amount of time to a peak threshold value stored in memory;
   (d) comparing a lowest value of the digital values received during the amount of time to a valley threshold value stored in the memory;
   (e) replacing the high analog reference voltage with a voltage representative of the peak threshold value when the highest value of the digital values is less than the peak threshold value; and
   (f) replacing the low analog reference voltage with a voltage representative of the valley threshold value when the lowest value of the digital values is greater than the valley threshold value.

2. The method according to claim 1, wherein step (a) comprises the steps of:
   (g) a controller providing a high digital reference voltage to a first D/A converter;
   (h) the first D/A converter converting the high digital reference voltage to the high analog reference voltage for transmission to the A/D converter;
   (i) the controller providing a low digital reference voltage to a second D/A converter; and
   (j) the second D/A converter converting the low digital reference voltage to the low analog reference voltage for transmission to the A/D converter.

3. The method according to claim 2, wherein step (e) comprises the steps of:
   (k) the controller providing the peak threshold value to the first D/A converter, wherein the peak threshold value is digital; and
   (l) the first D/A converter converting the peak threshold value to the voltage representative of the peak threshold value for transmission to the A/D converter.

4. The method according to claim 2, wherein step (f) comprises the steps of:

(m) the controller providing the valley threshold value to the second D/A converter, wherein the valley threshold value is digital; and
   (n) the second D/A converter converting the valley threshold value to the voltage representative of the valley threshold value for transmission to the A/D converter.

5. A method for increasing the effective resolution of an analog-to-digital (A/D) converter for converting analog voltages to digital values, the method comprising the steps of:
   (a) providing first high and low analog reference voltages to the A/D converter;
   (b) receiving the digital values from the A/D converter for an amount of time;
   (c) storing a highest digital value and a lowest digital value received during the amount of time;
   (d) replacing the first high analog reference voltage with a second high analog reference voltage that is a first predetermined number of steps above the highest digital value when the highest digital value is less than the first high analog reference voltage; and
   (d) replacing the first low analog reference voltage with a second low analog reference voltage that is a second predetermined number of steps below the lowest digital value when the lowest digital value is greater than the first low analog reference voltage.

6. The method according to claim 5, wherein:
   step (a) comprises the steps of:
   (f) a controller providing high and low digital values to first and second D/A converters; and
   (g) the first and second D/A converters converting the high and low digital values into the high and low analog reference voltages for transmission to the A/D converter.

7. Circuitry for converting analog signal voltages to digital values, the circuitry comprising:
   an analog-to-digital (A/D) converter for receiving the analog signal voltages and high and low analog reference voltages and for generating in accordance therewith the digital values;
   receiving means for receiving the digital values from the A/D converter for an amount of time;
   comparing means coupled to the receiving means for comparing a highest value of the digital values received during the amount of time to a peak threshold value stored in memory and for comparing a lowest value of the digital values received during the amount of time to a valley threshold value stored in the memory;
   first replacing means coupled to the comparing means and the A/D converter for replacing the high analog reference voltage with a voltage representative of the peak threshold value when the highest value of the digital values is less than the peak threshold value; and
   second replacing means coupled to the comparing means and the A/D converter for replacing the low analog reference voltage with a voltage representative of the valley threshold value when the lowest value of the digital values is greater than the valley threshold value.

8. The circuitry according to claim 7, wherein the receiving and comparing means is included in a controller coupled to the A/D converter and the memory.

9. The circuitry according to claim 7, wherein the first and second replacing means comprises a controller, coupled to the A/D converter and the memory, and first and second D/A converters coupled to the A/D converter and the controller.

10. The circuitry according to claim 7, wherein the circuitry is included in a data communication receiver for receiving analog signals, converting the analog signals to digital signals, and recovering messages from the digital signals.

11. Circuitry for converting analog signal voltages to digital values, the circuitry comprising:
- an analog-to-digital (A/D) converter for receiving the analog signal voltages and first high and low analog reference voltages and for generating in accordance therewith the digital values;
- receiving means for receiving the digital values from the A/D converter for an amount of time;
- storing means coupled to the receiving means for storing a highest digital value and a lowest digital value received during the amount of time;
- first replacing means coupled to the storing means and the A/D converter for replacing the first high analog reference voltage with a second high analog reference voltage that is a first predetermined number of steps above the highest digital value when the highest digital value is less than the first high analog reference voltage; and
- second replacing means coupled to the storing means and the A/D converter for replacing the first low analog reference voltage with a second low analog reference voltage that is a second predetermined number of steps below the lowest digital value when the lowest digital value is greater than the first low analog reference voltage.

12. The circuitry according to claim 11, wherein the receiving means comprises a controller coupled to the A/D converter.

13. The circuitry according to claim 12, wherein the storing means comprises a random access memory coupled to the controller.

14. The circuitry according to claim 13, wherein the first and second replacing means comprises the controller and first and second D/A converters coupled to the controller and the A/D converter for providing analog voltages thereto.

15. The circuitry according to claim 14, wherein the circuitry is included in a data communication receiver for receiving analog signals, converting the analog signals to digital signals, and recovering messages from the digital signals.

* * * * *